United States Patent
O'Bryan, Jr.

(10) Patent No.: US 6,577,492 B2
(45) Date of Patent: Jun. 10, 2003

(54) CAPACITOR HAVING EPOXY DIELECTRIC LAYER CURED WITH AMINOPHENYLFLUORENES

(75) Inventor: Nelson B. O'Bryan, Jr., Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 140 days.

(21) Appl. No.: 09/902,302

(22) Filed: Jul. 10, 2001

(65) Prior Publication Data

US 2003/0030966 A1 Feb. 13, 2003

(51) Int. Cl.$^7$ ................................................ H01G 4/06
(52) U.S. Cl. ........................ 361/311; 361/524; 523/466; 525/423
(58) Field of Search ................................. 361/311, 312, 361/313, 763, 321.5, 321.4; 29/25.41, 25.42, 830, 846; 523/466; 525/468, 423; 528/124, 27, 407

(56) References Cited

U.S. PATENT DOCUMENTS

| | | | |
|---|---|---|---|
| 3,790,869 A | * | 2/1974 | Tanimura et al. ............. 257/37 |
| 4,684,678 A | | 8/1987 | Schultz et al. ............... 523/466 |
| 5,010,641 A | | 4/1991 | Sisler ........................... 29/830 |

(List continued on next page.)

FOREIGN PATENT DOCUMENTS

| | | |
|---|---|---|
| EP | 0 008 107 | 2/1980 |
| EP | 0 902 048 A1 | 3/1999 |
| JP | S58-44789/1983 | 3/1983 |
| JP | S62-163387 | 7/1987 |
| JP | H1-100998 | 4/1989 |
| JP | H1-292895 | 11/1989 |
| JP | 2041312 | 2/1990 |
| JP | H2-65194/1990 | 3/1990 |
| JP | H3-500593/1991 | 2/1991 |
| JP | H3-136396/1991 | 6/1991 |
| JP | H4-361565/1992 | 12/1992 |
| JP | H6-37256 | 2/1994 |
| JP | H6-90086 | 3/1994 |
| JP | H6-104578 | 4/1994 |
| JP | H6-125180 | 5/1994 |
| JP | H6-252460 | 9/1994 |
| JP | H6-297634 | 10/1994 |
| JP | H6-318597 | 11/1994 |
| JP | H7-30257 | 1/1995 |
| JP | H7-30258 | 1/1995 |
| JP | 08148321 | 6/1996 |
| JP | 08198952 | 8/1996 |
| WO | WO 00/45624 | 8/2000 |

OTHER PUBLICATIONS

IPC Test Method Manual, IPC–TM–650, test No. 2.4.9, Oct. 1988, published by The Institute for Interconnecting and Packaging Electronic Circuits.

"A Novel Integrated Decoupling Capacitor for MCM–L Technology", Premjeet Chahal, Rao R. Tummala, Mark G. Allen and Madhavan Swaninathan; 1996 Electronic Components and Technology Conference, pp. 125–132.

"A Novel Integrated Decoupling Capacitor for MCM–L Technology", Premjeet Chahal, Rao R. Tummala, Mark G. Allen and Madhavan Swaminathan; *IEEE Transactions on Components, Packaging, and Manufacturing Technologyu*, Part B, vol. 21, No. 2, May 1998, pp 184–192.

*Handbook of Polymer Coatings for Electronics*, James Licari, Noyes Publication 1990, pp. 374–381.

(List continued on next page.)

*Primary Examiner*—Anthony Dinkins
(74) *Attorney, Agent, or Firm*—Scott A. Bardell

(57) ABSTRACT

A capacitor with a polymeric dielectric layer, the dielectric layer having a leakage current at 85° C. and 85% relative humidity of less than 100 nA/cm$^2$ using a 6 volt bias.

33 Claims, 2 Drawing Sheets

U.S. PATENT DOCUMENTS

| | | | |
|---|---|---|---|
| 5,027,253 A | | 6/1991 | Lauffer et al. ............... 361/321 |
| 5,051,275 A | * | 9/1991 | Wong ........................... 427/58 |
| 5,079,069 A | | 1/1992 | Howard et al. ............. 428/209 |
| 5,155,655 A | | 10/1992 | Howard et al. ............. 361/303 |
| 5,161,083 A | | 11/1992 | Mohler et al. ............... 361/321 |
| 5,162,977 A | | 11/1992 | Paurus et al. ................ 361/401 |
| 5,172,304 A | | 12/1992 | Ozawa et al. ............... 361/401 |
| 5,183,972 A | | 2/1993 | Duane et al. ................ 174/251 |
| 5,261,153 A | | 11/1993 | Lucas ........................... 29/830 |
| 5,469,324 A | | 11/1995 | Henderson et al. ....... 361/301.2 |
| 5,571,970 A | * | 11/1996 | Mutoh et al. ................. 73/724 |
| 5,701,032 A | | 12/1997 | Fischer et al. .............. 257/692 |
| 5,745,335 A | | 4/1998 | Hoffarth et al. ............ 361/313 |
| 5,796,587 A | | 8/1998 | Lauffer et al. .............. 361/763 |

OTHER PUBLICATIONS

"Integrated Capacitors Using Polymer–Ceramic Composites for MCM–L", Premjeet Chahal, Rao R. Tummala and Mark G. Allen, ISHM '96 Proceedings, pp. 126–131.

"Improvements and Recent Advances in Nanocomposite Capacitors Using a Colloidal Technique", Vishal Agarwal, Premjeet Chahal, Rao R. Tummala and Mark G. Allen; Packaging Research Center, Electrical and Computer Engineering, Georgia Institute of Technology, Atlanta, GA 30332–0560, date unknown.

"Barium Titanate/Epoxy Composite Dielectric Materials for Integrated Thin Film Capacitors", Shurong Liang, Seung R. Chong and Emmanuel P. Giannelis, Department of Materials Science and Engineering, Cornell University, Ithaca, NY 14853–1501, date unknown.

* cited by examiner

CAPACITOR HAVING EPOXY DIELECTRIC LAYER CURED WITH AMINOPHENYLFLUORENES

TECHNICAL FIELD

This invention relates to an electrical article, methods for making the electrical article, and circuit articles made therefrom.

BACKGROUND

The embedded capacitors described in WO 00/45624 include a polymeric insulating or electrically conducting layer between first and second self supporting substrates.

The dielectric material of the insulating layer is typically a metal oxide, such as tantalum oxide, or a high dielectric constant ceramic, such as barium titanate. The dielectric material is typically dispersed in a matrix of some thermally and mechanically stable polymer, such as an epoxy. The epoxy resin may be formulated with about 0.5 to about 8% by weight of a catalyst such as an amine or an imidazole, and 0.5 to 1% of 2,4,6-tris(dimethylaminomethyl)phenol is exemplified. The capacitors can be used as a layer in printed wiring boards and multichip modules to replace surface mounted discrete capacitors.

SUMMARY

In one embodiment, the invention is a capacitor including a polymeric dielectric layer, wherein the dielectric layer has a leakage current at 85° C. and 85% relative humidity of less than 100 nA/cm$^2$ using a 6 volt bias.

In this invention the polymeric dielectric layer is the reaction product of an epoxy resin and a 9,9-bis (aminophenyl)fluorene curing agent.

In a second embodiment, the capacitor has a change in temperature coefficient of capacitance between room temperature and 125° C. of less than 15%.

In a third embodiment, the invention is an electrical article with a dielectric layer including a cured epoxy resin composition, wherein the cured composition includes a unit of Formula 2:

In a fourth embodiment, the invention is an electrical article including a dielectric layer, wherein the dielectric layer is a cured epoxy resin composition, wherein the resin composition includes an epoxy resin and a curing agent of Formula 1:

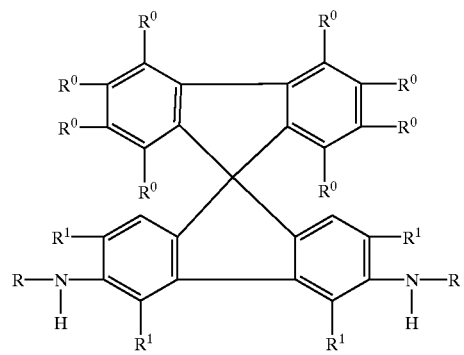

Formula 1 wherein each R$^0$ is independently selected from H, halogen, linear and branched alkyl groups having 1–6 carbon atoms, phenyl, nitro, acetyl and trimethylsilyl; each R is independently selected from H and linear and branched alkyl groups having 1–6 carbon atoms; and each R$^1$ is independently selected from R, H, phenyl and halogen.

In a fifth embodiment, the invention is an electrical article including a dielectric layer, wherein the dielectric layer includes a cured epoxy resin composition, the composition including an epoxy resin and an aminophenylfluorene curing agent, wherein the composition is heated to the cure temperature at a rate of 1° C. per minute.

In a sixth embodiment, the invention is a method for making a capacitor, including providing a first substrate having a major surface; coating an epoxy resin composition onto the major surface of the first substrate, wherein the epoxy resin composition includes an epoxy resin and an aminophenylfluorene curing agent; laminating a major surface of a second substrate to the epoxy resin composition to form a laminate; and heating the laminate for a time and a temperature sufficient to cure the epoxy resin composition.

In a seventh embodiment, the invention is an electrical or electronic device including the capacitor, such as, for example, a circuit board or a flexible circuit.

Compared to epoxy dielectric layers prepared with amine and imidazole catalysts, use of 9,9-bis(aminophenyl) fluorene curing agents reduces water adsorption in the dielectric layer. Furthermore, epoxy layers prepared with the 9,9-bis(aminophenyl)fluorene curing agents are less sensi-

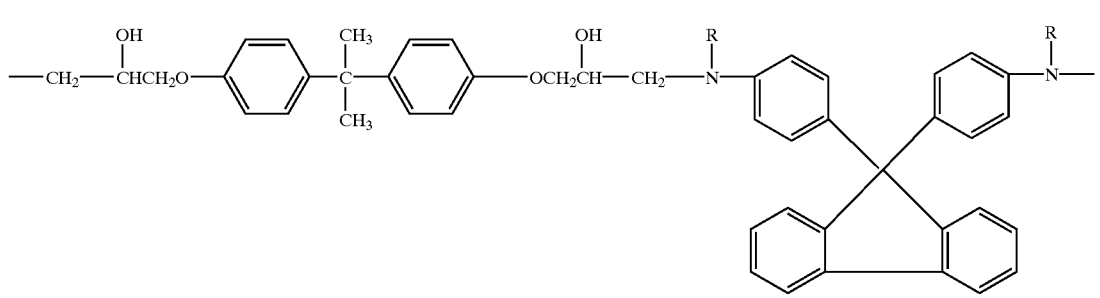

Formula 2 tive to the rate at which the dielectric layer is heated to the cure temperature. This reduced water absorption decreases the change of capacitance with humidity, which decreases the dissipation factor and leakage current in the capacitor structure.

A capacitor having an 9,9-bis(aminophenyl)fluorene cured dielectric layer also has a reduced temperature coefficient of capacitance compared to capacitors having dielectric layers prepared with conventional catalysts. The resulting capacitor structure meets or exceeds X7R capacitor specifications.

The epoxy dielectric layers prepared with the 9,9-bis(aminophenyl)fluorene curing agents are less susceptible to "pick-off" when wound into a roll after coating, and are resistant to adhesion loss during the long cure times that are often required as part of multiple epoxy curing steps used during printed circuit board manufacture.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
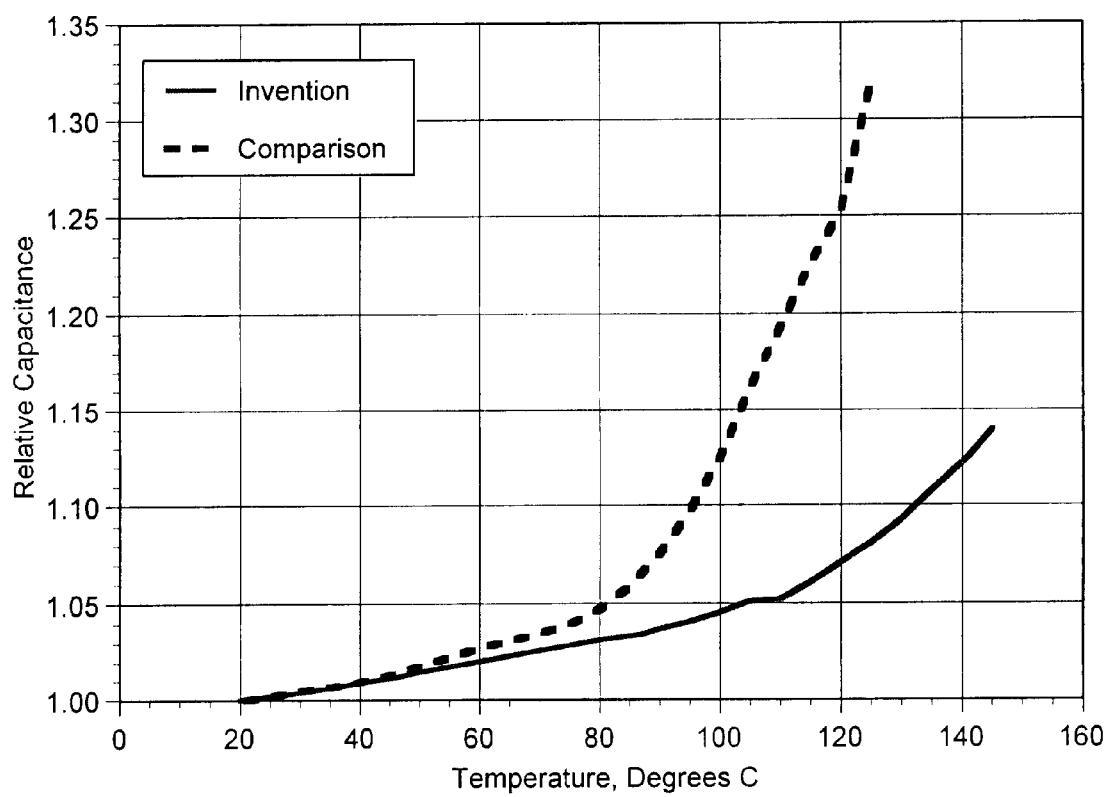
FIG. 1 compares the temperature dependence of capacitance using a 9,9-bis(3-chloro-4-aminophenyl)fluorene cured epoxy resin formulation and a phenol cured epoxy resin formulation.

In one aspect, the invention is a dielectric layer that may be used in an electrical article, such as a capacitor. Suitable electrical articles are described in WO 00/45624, which is incorporated herein by reference. The electrical articles described in WO 00/45624 generally include a first self-supporting substrate having two opposing major surfaces and a second self-supporting substrate having two opposing major surfaces. A dielectric layer between the first and second substrate provides an electrical insulating function and adheres the two substrates.

The dielectric layer of the electrical article, which may be made of one or more layers, is made of a polymer. Any polymer may be used that can withstand the temperatures encountered in a typical solder reflow operation, for example, about 180 to about 290° C. Suitable polymeric materials for the dielectric layer include epoxy resins and blends thereof. The epoxy resin compositions used to make the dielectric layer in the electrical article of the invention include at least one aromatic polyepoxide and at least one 9,9-bis(aminophenyl)fluorene (also referred to as "aminophenylfluorene" herein) curing agent present in an amount sufficient to provide about 0.1 to about 1.1 amino groups per epoxy group present in the aromatic polyepoxide. In this application aromatic polyepoxide means a molecule that includes more than one epoxide group, which are attached directly or indirectly to an aromatic group. The term epoxy resin composition will be used to refer to an uncured composition including an aromatic polyepoxide and a 9,9-bis(aminophenyl)fluorene curing agent that can be cured to form a cured epoxy resin.

The thermally curable epoxy resin compositions of the invention preferably include one or more aromatic polyepoxides and one or more 9,9-bis(aminophenyl)fluorene curing agents. Preferred aromatic polyepoxides include poly (glycidyl ether)s of polyhydric phenols. Suitable aromatic polyepoxides include the epoxy resins available from Shell Chemical Company, Houston, Tex., under the trade designation EPON 1001F and EPON 1050. Particularly preferred resins include blends of a diglycidylether of bisphenol A and a novolac epoxy, for example, 75 to 90% by weight Epon 1001F and 25 to 10% by weight Epon 1050F based on the total weight of the resin. A suitable 9,9-bis(aminophenyl) fluorene curing agent for use in the epoxy resin compositions of the invention is described in U.S. Pat. No. 4,684,678, incorporated herein by reference, and has a general Formula 1:

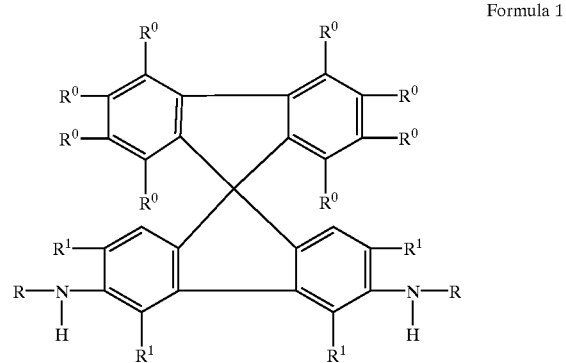

Formula 1 wherein
is each $R^0$ is independently selected from H, halogen, linear and branched alkyl groups having 1–6 carbon atoms, phenyl, nitro, acetyl and trimethylsilyl;
each R is independently selected from H and linear and branched alkyl groups having 1–6 carbon atoms; and
each $R^1$ is independently selected from R, H, phenyl and halogen.

Preferred curing agents include 9,9 bis(aminophenyl) fluorenes, and 9,9 bis(3-chloro-4-aminophenyl)fluorene (CAF) and 9,9-bis(3-methyl-4-aminophenyl)fluorene (OTBAF) are particularly preferred.

The 9,9 bis(aminophenyl)fluorene curing agent should be present in the epoxy resin composition in an amount sufficient to provide from 0.1 to 1.1 amino groups, NH—R, per epoxide group in the aromatic polyepoxide.

When embedded capacitor material is laminated into conventional printed circuit boards, lamination temperatures are typically about 175° C. Lamination times depend upon the number of lamination cycles required, but are typically more than about two hours. However, in some applications, the lamination temperature for fabrication of a device containing embedded capacitor material may be higher, about 225° C., for example. At this temperature, adhesion between the dielectric layer and the copper substrate can become unacceptably low. The composition of the dielectric layer in the present invention can be modified to make adhesion loss during extended 225° C. lamination processes acceptable. Certain properties, such as adhesion between the dielectric layer and the copper substrate at higher temperatures, may be adjusted by controlling, for example, the amount and/or rate of cross-linking in the cured composition. In cases where a slow cross-linking reaction is preferred, it may be preferable to reduce the amount of 9,9 bis(aminophenyl) fluorene curing agent present in the epoxy resin composition.

Optionally, other catalysts may be used in the epoxy resin composition such as, for example, amines and imidazoles. Suitable supplementary catalysts are described in WO 00/45624 and U.S. Pat. No. 4,684,678, and preferred catalysts include 2,4,6-tris(dimethylaminomethyl)phenol and 5-aminobenzotriazole. Use of 5-aminobenzotriazole may also improve adhesion between the dielectric layer and the substrate layers.

substantially uniform mixture is subsequently coated on a suitable substrate, then heated for a time and a temperature sufficient to remove volatile components and cure the composition. The resulting cured epoxy resin composition forms the dielectric layer of the electrical article. During cure, the aromatic polyepoxide and the aminophenylfluorene curing agent react to form a cured epoxy resin having the units of Formula 2:

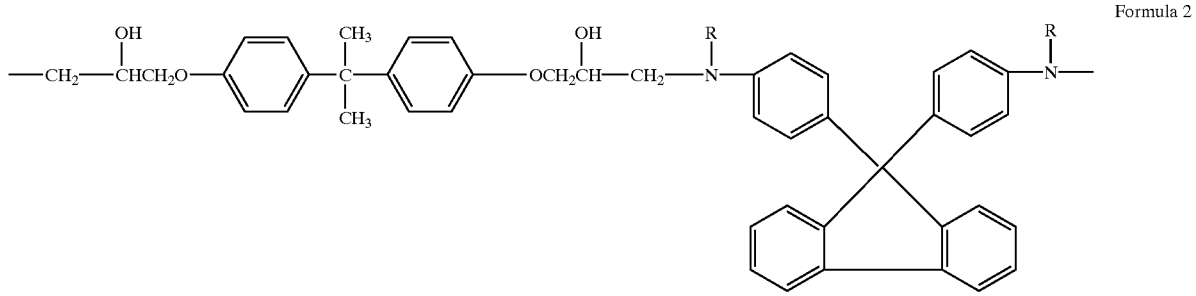

Formula 2

In addition, conventional epoxy resin curing agents, such as, for example, polyamines, polyamides, polyphenols and derivatives thereof, may be added to the epoxy resin composition in an amount ranging from about 10 to about 100% by weight, preferably about 10 to about 50% by weight of resin. Suitable curing agents include 1,3 phenylenediamine.

The epoxy resin composition may also include conventional additives such as dispersants and solvents. Examples of suitable dispersants include, for example, a copolymer of polyester and polyamine, commercially available from Uniqema, New Castle, Del., under the trade designation HYPERMEER PS3. Examples of solvents include methyl ethyl ketone and methyl isobutyl ketone. Other additives, such as agents to change viscosity or to produce a level coating, can be used.

The epoxy resin composition also preferably includes a plurality of particles. Suitable particles are described in WO 00/45624, and include barium titanate, barium strontium titanate, titanium oxide, lead zirconium titanate, and mixtures thereof. A preferred commercially available barium titanate is available from Cabot Performance Materials, Boyertown, Pa., under the trade designation BT-8. The particles may be any shape and may be regularly or irregularly shaped. Exemplary shapes include spheres, platelets, cubes, needles, oblate, spheroids, pyramids, prisms, flakes, rods, plates, fibers, chips, whiskers, and mixtures thereof. The particle size, i.e., the smallest dimension of the particle, typically ranges from about 0.05 to about 11 $\mu$m, preferably 0.05 to 3.0 $\mu$m, more preferably 0.05 to 2 $\mu$m. Preferably, the particles have a size allowing at least two to three particles to be stacked vertically within the electrically insulating layer thickness.

The loading of particles in the polymer is typically 20 to 70% by volume, preferably 30 to 60% by volume, more preferably 40 to 55% by volume, based on the total volume of the dielectric layer.

As described in detail in WO 00/45624, the particles are preferably cleaned and dried prior to incorporation into the epoxy resin composition.

The epoxy resin composition is typically formed by mixing the epoxy resin, the aminophenylfluorene curing agent, particles, and other optional ingredients. The resulting The preferred cured epoxy resin composition absorbs less than 0.6 weight percent moisture over 24 hours time and has a $T_g$ of at least 90° C. A suitable test for water absorption is Test 2.6.2.1 from the IPC-TM-650 Test Methods Manual.

The substrates of the electrical article of the invention may include a single layer, or a plurality of layers arranged in a laminate structure. The first and second substrates may be made of graphite; composites such as silver particles in a polymer matrix; metal such as copper or aluminum; combinations thereof, or laminates thereof. A multilayer substrate may be made by coating a layer of metal, such as copper or aluminum, onto a removable carrier layer. For example, copper layer may be coated onto a removable polyester carrier. The first and second substrates may be the same or different. The electrical article of the invention may include multiple, interdigitated insulating and conductive layers.

A substrate in accordance with the electrical articles of the invention is preferably self-supporting. The term "self-supporting substrate" refers to a substrate having sufficient structural integrity such that the substrate is capable of being coated and handled. It is preferable that a substrate is flexible; however, rigid substrates may also be used.

Typically, the major surface of the first substrate in contact with the electrically insulating layer and the major surface of the second substrate in contact with the electrically insulating layer are electrically conductive when forming a capacitor. Surface treatment, which adds material to these major surfaces by, for example, oxidation or reaction with a coupling agent, may be used to promote adhesion. Alternatively, a separate coating step may be performed to apply an adhesion promoting primer, such as 5-aminobenzotriazole. Treatment of the substrate surface with 5-aminobenzotriazole may be particularly relevant for copper foils not having a chromate anti-tarnish surface treatment. The resulting material on the major surface of the substrate itself may not necessarily be conductive, but a capacitor is formed provided the substrates themselves are conductive.

Preferably, a substrate has a thickness ranging from 0.5 to 3 mils (approximately 10 to 80 $\mu$m), more preferably 0.5 to 1.5 mils (approximately 10 to 38 $\mu$m).

When the substrate is a metal, the metal preferably has an anneal temperature which is at or below the temperature for curing the electrically insulating layer, or the metal is annealed before the electrically insulating layer is coated.

A preferred substrate is copper. Exemplary copper includes copper foil available from Carl Schlenk, AG, Nurnberg, Germany.

A method for manufacturing an electrical article of the invention, which is described in detail in WO 00/45624, includes providing a first substrate having two opposing major surfaces. An epoxy resin composition may then be coated onto a first major surface of the first substrate. A second substrate, having two opposing major surfaces, is laminated to the epoxy resin composition on the first major surface of the first substrate. The resulting laminate is then heated for a time and a temperature sufficient to cure the epoxy resin composition.

Alternatively, the second substrate may also include an epoxy resin composition on its first major surface and the first and second substrates may be laminated together to connect the first major surface of each of the first and second substrate, i.e., the epoxy resin coated side of each substrate may be laminated together.

The major surfaces of the substrates are preferably substantially free of debris or chemisorbed or adsorbed materials to maximize adhesion with the electrically insulating layer. Exemplary methods are described in WO 00/45624 and include treating with an argon-oxygen plasma or with an air corona, or wet chemical treatment. Particulates adhering to both sides of the substrate can be removed using, for example, an ultrasonic/vacuum web cleaning device commercially available for Web Systems Inc., Boulder, Colo., under the trade designation ULTRACLEANER. Alternatively, the substrate may be cleaned using a tacky roller system such as manufactured by Polymag Tech of Rochester, N.Y. Preferably, the substrate is not scratched, dented, or bent during this surface treatment step in order to avoid possible coating problems and coating defects which may result in non-uniform coating or shorted articles, such as shorted capacitors.

If a mixture of an aminophenylfluorene and a phenol catalyst is used, metal substrates, such as copper foils that have no chromate anti-tarnish surface treatment, may require a separate coating step to apply an adhesion promoting primer such as, for example 5-aminobenzotriazole. Preferably, the phenol catalyst is entirely eliminated and replaced with 5-aminobenzotriazole, which provides a reduced cure time and eliminates the separate priming step. With this formulation, it is possible, using the same process, to use copper foils having a chromate anti-tarnish surface treatment and foils having no anti-tarnish treatment.

The cleaned copper foil may be coated with the epoxy resin composition using any suitable method, for example, a gravure coater. The resin composition is then dried to remove residual solvent. The dry thickness of the coated epoxy resin composition depends on the percent solids in the composition, the relative speeds of the gravure roll and the coating substrate, and on the cell volume of the gravure used. Typically, to achieve a dry thickness in the range of about 0.5 to about 2 $\mu$m, the percent solids in the epoxy resin composition are about 20 to 75% by weight. The coating is preferably dried to a substantially tack-free state in the oven of the coater, typically at a temperature of less than about 100° C. More preferably, the coating is dried in stages starting with a temperature of about 30° C. and ending with a temperature of about 100° C., and then wound onto a roll. Higher final drying temperatures, e.g. up to about 200° C. can be used, but are not required.

Generally, very little cross-linking occurs during the drying step; its purpose is primarily to remove as much solvent as possible. Retained solvent may lead to blocking (i.e., unwanted interlayer adhesion) when the coated epoxy resin composition is stored on a roll and to poor adhesion for the laminate. More specifically, if there is residual solvent in the coating, or if the copper foil is uneven, there can be tendency for a small portion of the coating to stick to the opposite side of the foil on the adjacent wrap, leaving a pinhole-like defect in the coating (referred to as "pick-off"). This defect can cause a direct short, or premature breakdown under an applied voltage. Aminophenylfluorene catalyzed epoxy resin composition coatings are considerably less prone to this defect than are epoxy coatings catalyzed by phenol catalysts.

Coating techniques to avoid defects include in-line filtration and deaeration (to remove air bubbles) of the coating mixture. In addition, it is preferable, before laminating two substrates coated with a dielectric layer, that at least one of the dielectric layers is partially cured, preferably in air. In particular, adhesion of the substrate may be improved by heat treating the coating before lamination. The time for heat treatment is preferably short, for example, less than about 10 minutes, particularly at higher temperatures.

Lamination is preferably carried out using two of the coated substrates described above. One of the coated substrates may go through an oven or over a heated roller before reaching the laminator, for example, at a temperature ranging from about 125 to about 175° C. for less than 30 seconds, and more preferably at a temperature about 125 to about 160° C. This preliminary heating step can be done on one or both of the coated substrates. To make an electrical article of the present invention, the coated substrates may be laminated, dielectric layer to dielectric layer, using a laminator with two nip rollers heated to a temperature ranging from about 120 to about 200° C., preferably about 135° C. Suitable air pressure is supplied to the laminator rolls, preferably at a pressure ranging from about 5 to about 40 psi (34 to 280 kPa), preferably about 15 psi (100 kPa). The roller speed can be set at any suitable value and preferably ranges from about 12 to about 36 inches/minute (0.5 to 1.5 cm/second), more preferably about 15 inches/minute (0.64 cm/second). This process can be conducted in a batch mode as well.

The laminated material can be cut into sheets of the desired length or wound onto a suitable core.

The laminated material is then heated for a sufficient time and temperature to cure the epoxy resin composition. Exemplary curing temperatures include temperatures ranging from about 150 to about 225° C., preferably about 160 to about 200° C., and exemplary curing times include a period ranging from about 90 to about 180 minutes, preferably about 90 to about 120 minutes.

Adhesion of the dielectric layer to a metal substrate may be enhanced if the metal is sufficiently soft at the time of coating or becomes soft during lamination and/or cure; i.e., the foil is annealed before coating or becomes annealed during subsequent processing. Annealing may be accomplished by heating the substrate before the coating step or as a result of the curing or drying step if the metal anneal temperature is at or lower than the cure temperature of the epoxy resin composition. It is preferred to use a metal substrate with an anneal temperature below the temperature at which curing occurs. Annealing condition will vary depending on the metal substrate used. Preferably, in the case of copper, at either of these stages in the process, the metal substrate obtains a Vickers hardness, using a 10 g load, of less than about 75 kg/mm$^2$. A preferred temperature range of copper to achieve this hardness ranges from about 100 to about 180° C., more preferably about 120 to about 160° C.

Subsequent to cure, the force required to separate the first and second substrates of the electrical article at a 90 degree peel angle is greater than about 3 pounds/inch (about 0.5 kiloNewtons/meter (kN/m)), preferably greater than 4 pounds/inch (0.7 kN/m), more preferably greater than 6 pounds/inch (1 kN/m), as measured according to the IPC Test Method Manual, IPC-TM-650, test number 2.4.9 dated October 1988, as published by the Institute for Interconnecting and Packaging Electronic Circuits. If more than two substrates are present in an electrical article of the present invention, this force is required to separate any pair of substrates separated by an electrically insulating or electrically conducting layer.

Although an electrical article of the present invention can be functional as it is fabricated, the electrical article may preferably be patterned as described below, for example, to form discrete islands or removed regions in order to limit lateral conductivity. The patterned electrical article may be used as a circuit article itself or as a component in a circuit article, as described below.

A surface of the first or second substrate of the electrical article that is accessible may be contacted, for example, by an electrical trace, to make electrical contact so that the first or second substrate acts as an electrode. In addition, it may be desirable to make electrical contact with the major surface of the first or second substrate in contact with the dielectric layer or to provide a through hole contact. Through hole contacts are useful when no interaction with the electrical device is desired. In order to reach the major surface of the first or second substrate in contact with the dielectric layer or to provide a through hole contact, the electrical article may be patterned.

Any suitable patterning technique known in the art may be employed. Suitable patterning techniques are described in WO 00/45624.

The electrical article of the present invention itself may function as a circuit article, with some modification. In one instance, the electrical article may be patterned. In this instance, a circuit article may be prepared by providing an electrical article of the present invention and patterning the electrical article as described above to provide a contact for electrical connection. Either one or both sides of the electrical article are patterned to allow access to each major surface of the first and second substrates and to provide a through hole contact.

In another embodiment, a circuit article may be prepared by a method comprising the steps of providing an electrical article of the present invention, providing at least one electrical contact, and connecting the contact to at least one substrate of the electrical article.

An electrical article of the present invention may further comprise one or more additional layers, for example, to prepare a PWB or flexible circuit. The additional layer may be rigid or flexible. Exemplary rigid layers include fiberglass/epoxy composite commercially available from Polyclad, Franklin, N.H., under the trade designation PCL-FR-226, ceramic, metal, or combinations thereof. Exemplary flexible layers comprise a polymer film such as polyimide or polyester, metal foils, or combinations thereof. Polyimide is commercially available from DuPont under the trade designation KAPTON and polyester is commercially available from Minnesota Mining and Manufacturing Company (3M), St. Paul, Minn., under the trade designation SCOTCHPAR. These additional layers may also contain electrically conductive traces on top of the layer or embedded within the layer. The term electrically conductive traces refers to strips or patterns of a conductive material designed to carry current. Suitable materials for an electrically conductive trace comprise copper, aluminum, tin, solder, silver paste, gold, and combinations thereof.

In this embodiment, a preferred method of making a circuit article comprises the steps of providing an electrical article of the present invention, patterning at least one side of the electrical article, providing an additional layer, attaching the layer to the electrical article, and providing at least one electrical contact to at least one substrate of the electrical article. Preferably, a second additional layer is provided and attached to the electrical article.

An electrical article of the present invention can be used in a PWB, for example, a flexible circuit, as a component, which functions as a capacitor. The capacitance of the article at 125° C. is within 15% of the room temperature value and has a leakage current at 85° C. and 85% relative humidity less than 100 nA using a 6 volt bias.

The electrical article may be embedded or integrated in the PWB or flexible circuit. Methods for manufacturing a flexible circuit or PWB using the electrical article of the present invention are described in WO 00/45624 and are cited herein by reference.

The present invention also encompasses an electrical device comprising an electrical article of the present invention functioning in an electrical circuit of a circuit board (PWB) or a flexible circuit. The electrical device may include any electrical device which typically employs a PWB or flexible circuit having a capacitive component. Exemplary electrical devices include cell phones, telephones, fax machines, computers, printers, pagers, and other devices as recognized by one skilled in the art. The electrical article of the present invention is particularly useful in electrical devices in which space is at a premium or that operate at frequencies greater than 1 GHz.

This invention is illustrated by the following examples, but the particular materials and amounts thereof recited in these examples, as well as other conditions and details should not be construed to unduly limit this invention.

EXAMPLES

EXAMPLE 1

Electrical Article with (Aminophenyl)fluorene Cured Electrically Insulating Layer Containing 5-Aminobenzotriazole

| Component | Grams |
| --- | --- |
| Epon 1001F + Epon 1050 | 16.0 |
| 9,9-bis(3-chloro-4-aminophenyl)fluorine | 4.0 |
| Barium titanate, 0.2 μm (Cabot Performance Materials) | 78.7 |
| PS3 polyester/polyamine copolymer dispersant (Uniqema) | 1.3 |
| 5-aminobenzotriazole | 0.08 |

The above dispersion was coated onto copper foil (1 ounce foil, 35 μm thick) using a gravure or die coating technique. The dispersion can be coated on untreated copper foil without the necessity of a separate priming step. Dry thicknesses of the dielectric ranged from approximately 2.0 to 5.0 μm. The coating was dried to a tack-free surface, then wound into rolls. Two rolls were subsequently laminated, coated side to side, using two heated nip rollers. A standard photoresist laminator works well for small samples. The laminated material was cured at 180° C. for approximately 1.5 to 2 hours. The cured panels were then patterned on one or both sides using conventional photoresist and etchant to produce individual capacitors.

EXAMPLE 2

Electrical Article with (Aminophenyl)fluorene Cured Electrically Insulating Layer Containing 2,4,6-Tris(dimethylaminomethyl)phenol

| Component | Grams[a] | Grams |
|---|---|---|
| Epon 1001F epoxy (Shell Chemical) | 20.2 | 16.2 |
| Epon 1050 epoxy (Shell Chemical) | 5.0 | 4.0 |
| 9,9-bis(3-chloro-4-aminophenyl)fluorene (CAF)[b] | 0 | 5.1 |
| Barium titanate, 0.2 µm (Cabot Performance Materials) | 100 | 100 |
| PS3 polyester/polyamine copolymer dispersant (Uniqema) | 1.8 | 1.8 |
| Methyl ethyl ketone/methyl isobutyl ketone (4:6) | 127 | 127 |
| 2,4,6-tris(dimethylaminomethyl)phenol | 0.25 | 0.025 or 0 |

[a]Standard formulation using only 2,4,6-tris(dimethylaminomethyl)phenol catalyst as the curing agent.
[b]9,9-bis(3-methyl-4-aminophenyl)fluorene (OTBAF) was also used.

The above dispersions were coated onto copper foil (1 ounce foil, 35 µm thick) using a gravure or die coating technique. Adhesion promoting agents such as 5-aminobenzotriazole may be coated onto the substrate prior to coating by the epoxy. Typically a dilute solution, e.g., 0.05 to 0.15% by weight in an alcohol such as methanol, is applied by standard coating techniques and the substrate dried. Dry thicknesses of the dielectric ranged from approximately 2.0 to 5.0 µm. The coating was dried to a tack-free surface, then wound into rolls. Two rolls were subsequently laminated, coated side to side, using two heated nip rollers. A standard photoresist laminator works well for small samples. The laminated material was cured at 180° C. for approximately 2 hours. The cured panels were then patterned on one or both sides using conventional photoresist and etchant to produce individual capacitors.

Figure 2:
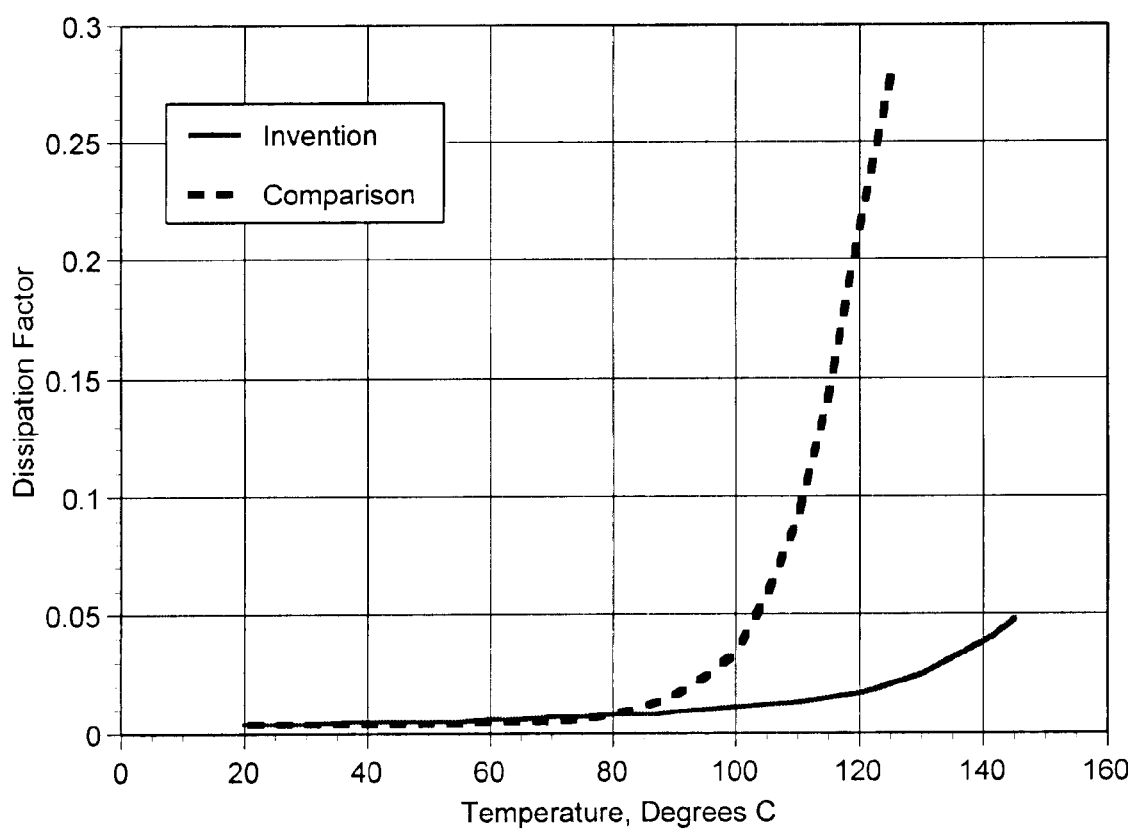
FIG. 2 compares the temperature dependence of dissipation factor for a 9,9-bis(3-chloro-4-aminophenyl)fluorene cured epoxy resin formulation and a phenol cured epoxy resin formulation.

The temperature dependence of capacitance and dissipation factor is shown in FIG. 1 and FIG. 2. The leakage current was measured by subjecting the capacitor to a voltage bias in an 85° C., 85% relative humidity environment. For example, when a capacitor with the standard formulation was subjected to a 6 volt bias under these conditions, the leakage current was 100 nA/cm$^2$. A similar capacitor with the aminophenylfluorene crosslinked epoxy had a leakage current of only 10 nA/cm$^2$, an order of magnitude improvement.

EXAMPLE 3

Capacitor with (Aminophenyl)fluorene Cured Electrically Insulating Layer Containing 5-Aminobenzotriazole for High Temperature Applications

| Component | Sample A Grams | Sample B Grams |
|---|---|---|
| Epon 1001F + Epon 1050 epoxy (Shell Chemical) | 16.0 | 16.8 |
| 9,9-bis(3-chloro-4-aminophenyl)fluorine (CAF) | 4.0 | 3.2 |
| Amine equivalent/epoxy equivalent ratio | 1:1 | 0.6:1 |
| Barium Titanate | 78.7 | 78.7 |
| PS3 polyester/polyamine copolymer dispersant (Uniqema) | 1.3 | 1.3 |
| 5-aminobenzotriazole catalyst | 0.08 | 0 |
| Initial cure temperature, ° C. | 180 | 225 |
| Adhesion after initial cure, lbs/inch | 4.4 | 3.4 |
| Adhesion after 6 hours at 225° C., lbs/inch | 2.0 | 4.0 |

This example compares two panels made with the same raw materials, but with changes in the ratio of fluorene compound to epoxy, presence of a catalyst, and the initial cure temperature. The above dispersions were coated onto copper foil (1 ounce foil, 35 µm thick) using a gravure or die coating technique. The dispersion can be coated on untreated copper foil without the necessity of a separate priming step. Dry thicknesses of the dielectric ranged from approximately 2.0 to 5.0 µm. The coating was dried to a tack-free surface, then wound into rolls. Two rolls were subsequently laminated, coated side to side, using two heated nip rollers. A standard photoresist laminator works well for small samples. The laminated materials were cured at either 180° C. (Sample A) or 225° C. (Sample B) for approximately 1.5 to 2 hours. The cured panels were then patterned on one or both sides using conventional photoresist and etchant to produce individual capacitors. Adhesion was measured using a 90 degree peel strength as described above.

A number of embodiments of the invention have been described. Nevertheless, it will be understood that various modifications may be made without departing from the spirit and scope of the invention. Accordingly, other embodiments are within the scope of the following claims.

What is claimed is:

1. A capacitor comprising a polymeric dielectric layer, wherein the dielectric layer has a leakage current at 85° C. and 85% relative humidity of less than 100 nA/cm$^2$ using a 6 volt bias.

2. The capacitor of claim 1, wherein the dielectric layer is the reaction product of an epoxy resin and an 9,9-bis (aminophenyl)fluorene curing agent.

3. The capacitor of claim 2, wherein the dielectric layer further comprises dielectric particles.

4. The capacitor of claim 3, wherein the dielectric particles are selected from the group consisting of barium titanate, barium strontium titanate, titanium oxide, lead zirconium titanate, and combinations thereof.

5. A capacitor comprising a polymeric dielectric layer, wherein the capacitor has a change in temperature coefficient of capacitance between room temperature and 125° C. of less than 15%.

6. The capacitor of claim 5, wherein the dielectric layer is the reaction product of an epoxy resin and an 9,9-bis (aminophenyl)fluorene curing agent.

7. The capacitor of claim 6, wherein the dielectric layer further comprises dielectric particles.

8. The capacitor of claim 7, wherein the dielectric particles are selected from the group consisting of barium titanate, barium strontium titanate, titanium oxide, lead zirconium titanate, and combinations thereof.

9. An electrical article with a dielectric layer comprising a cured epoxy resin composition, wherein the cured composition comprises a unit of Formula 2:

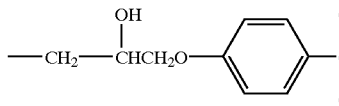 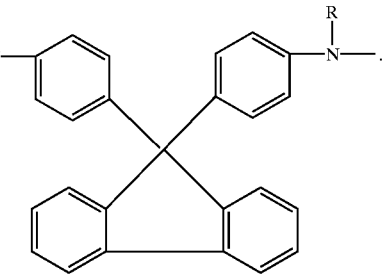

10. The electrical article of claim 9, wherein the epoxy resin composition is the reaction product of an epoxy resin and an 9,9-bis(aminophenyl)fluorene curing agent.

11. The electrical article of claim 10, wherein the dielectric layer further comprises dielectric particles.

12. The electrical article of claim 11, wherein the dielectric particles are selected from the group consisting of barium titanate, barium strontium titanate, titanium oxide, lead zirconium titanate, and combinations thereof.

13. The electrical article of claim 10, wherein the curing agent is selected from the group consisting of 9,9-bis(3-methyl-4-aminophenyl)fluorene, 9,9-bis(3-chloro-4-aminophenyl)fluorene, and combinations thereof.

14. An electrical article comprising a dielectric layer, wherein the dielectric layer is a cured epoxy resin composition, wherein the resin composition comprises an epoxy resin and a curing agent of Formula 1:

wherein
each $R^0$ is independently selected from H, halogen, linear and branched alkyl groups having 1–6 carbon atoms, phenyl, nitro, acetyl and trimethylsilyl;
each R is independently selected from H and linear and branched alkyl groups having 1–6 carbon atoms; and
each $R^1$ is independently selected from R, H, phenyl and halogen.

15. The electrical article of claim 14, wherein the epoxy resin is selected from the group consisting of diglycidyl ethers of polyhydric phenols, epoxy novolac resins, and combinations thereof.

16. The electrical article of claim 14, wherein
each $R^0$ is hydrogen,
each R is independently selected from hydrogen or alkyl; and
each $R^1$ is independently selected from hydrogen, chlorine, or alkyl.

17. The electrical article of claim 14, wherein the epoxy resin composition further comprises particles selected from the group consisting of barium titanate, barium strontium titanate, titanium oxide, lead zirconium titanate, and combinations thereof.

18. The electrical article of claim 14, wherein the epoxy resin composition further comprises a catalyst.

19. The electrical article of claim 18, wherein the catalyst is selected from the group consisting of 2,4,6-tris(dimethylaminomethyl)phenol, 5-aminobenzotriazole, and combinations thereof.

20. An electrical article comprising a dielectric layer, wherein the dielectric layer comprises a cured epoxy resin composition, the composition comprising an epoxy resin and an aminophenylfluorene curing agent, wherein the composition is heated to the cure temperature at a rate of 1° C. per minute.

21. A method for making a capacitor, comprising:
a. providing a first substrate having a major surface;
b. coating an epoxy resin composition onto the major surface of the first substrate, wherein the epoxy resin composition comprises an epoxy resin and an aminophenylfluorene curing agent;
c. laminating a major surface of a second substrate to the epoxy resin composition to form a laminate; and
d. heating the laminate for a time and a temperature sufficient to cure the epoxy resin composition.

22. The method of claim 21, further comprising drying epoxy resin composition prior to step (c).

23. The method of claim 21, further comprising treating the major surfaces of the first and second substrates to enhance adhesion to the epoxy resin composition.

24. The method of claim 21, wherein the epoxy resin composition further comprises particles selected from the group consisting of barium titanate, barium strontium titanate, titanium oxide, lead zirconium titanate, and combinations thereof.

25. The method of claim 21, wherein the curing agent is selected from the group consisting of 9,9 bis (3-chloro-4-aminophenyl)fluorene (CAF) and 9,9-bis(3-methyl-4-aminophenyl)fluorene (OTBAF).

26. The method of claim 21, wherein the first and second substrates comprise copper.

27. The method of claim 21, further comprising heating at least one of the first and second substrates prior to step (c).

28. The method of claim 21, wherein the major surface of the second substrate comprises a dielectric layer, and the dielectric layer is laminated to the epoxy resin composition on the first substrate.

29. The method of claim 28, wherein the dielectric layer on the second substrate is an epoxy resin composition comprising an epoxy resin and an aminophenylfluorene curing agent.

30. The method of claim 21, further comprising patterning at least one of the first and second substrates.

31. A circuit board comprising the capacitor of claim 1.

32. A flexible circuit comprising the capacitor of claim 1.

33. An electronic device comprising the capacitor of claim 1.

* * * * *

UNITED STATES PATENT AND TRADEMARK OFFICE
CERTIFICATE OF CORRECTION

PATENT NO. : 6,577,492 B2 Page 1 of 1
APPLICATION NO. : 09/902302
DATED : June 10, 2003
INVENTOR(S) : Nelson B. O'Bryan, Jr.

It is certified that error appears in the above-identified patent and that said Letters Patent is hereby corrected as shown below:

Title page,
Item (56), References Cited, U.S. PATENT DOCUMENTS, Page 2, delete "5,161,083 A 11/1992 Mohler et al." and insert in place thereof -- 5,161,086  11/1992  Howard et al. --.
Item (56), References Cited, U.S. PATENT DOCUMENTS, Page 2, delete "5,745,355" and insert in place thereof -- 5,745,334 --.

Column 4,
Line 33, delete "is each" and insert in place thereof -- each --.

Signed and Sealed this

Nineteenth Day of December, 2006

JON W. DUDAS
*Director of the United States Patent and Trademark Office*